(12) United States Patent
Yamada

(10) Patent No.: US 6,563,869 B1
(45) Date of Patent: May 13, 2003

(54) DIGITAL SIGNAL PROCESSING CIRCUIT AND AUDIO REPRODUCING DEVICE USING IT

(75) Inventor: Yuji Yamada, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/310,172

(22) Filed: May 12, 1999

(30) Foreign Application Priority Data

May 15, 1998 (JP) .......................................... 10-133308

(51) Int. Cl.$^7$ ................................................ H03H 7/40
(52) U.S. Cl. ....................... 375/232; 375/350; 708/301; 708/309; 708/322; 704/502; 381/63; 381/66; 381/74; 381/370
(58) Field of Search ................................ 375/230, 232, 375/350; 708/300, 301, 309, 322; 704/502; 381/63, 66, 74, 98, 103, 370, 94, 1.37

(56) References Cited

U.S. PATENT DOCUMENTS

| 5,204,827 A | * | 4/1993 | Fujita et al. ................. 708/313 |
| 5,432,856 A | * | 7/1995 | Shioda ........................ 181/206 |
| 5,579,396 A | * | 11/1996 | Iida et al. ....................... 381/1 |
| 5,717,617 A | * | 2/1998 | Chester ....................... 708/313 |
| 5,717,727 A | * | 2/1998 | Yamada et al. ............. 375/350 |
| 5,723,002 A | * | 3/1998 | Delk et al. .................. 607/114 |
| 5,903,232 A | * | 5/1999 | Zarubinsky et al. .......... 341/61 |
| 5,987,145 A | * | 11/1999 | Lawton ....................... 381/103 |
| 6,052,470 A | * | 4/2000 | Mouri ........................ 381/18 |
| 6,058,404 A | * | 5/2000 | Mahant-Shetti et al. .... 708/301 |
| 6,161,118 A | * | 12/2000 | Jinghui ....................... 708/313 |
| 6,487,573 B1 | * | 11/2002 | Jiang et al. ................. 708/313 |

* cited by examiner

Primary Examiner—Stephen Chin
Assistant Examiner—Dac V. Ha
(74) Attorney, Agent, or Firm—Jay H. Maioli

(57) ABSTRACT

For a left-channel input audio signal, digital filters 30LL and 30LR are provided for reproduction of impulse responses used for locating an acoustic image outside the head of a listener, and for a right-channel input audio signal, digital filters 30RL and 30RR are provided for reproduction of impulse responses for locating an acoustic image outside the listener's head. An addition circuit 7L adds output signals of the digital filters 30LL and 30RL to each other and a second addition circuit 7R adds output signals of the digital filters 30LR and 30RR to each other. Output signals of the addition circuits 7L and 7R are supplied to a headphone, whereby the reproduction acoustic images of the left-channel and right-channel input audio signals are located outside the listener's head. The sampling rate in each of the digital filters 30LL-30RR is changed depending on the section of the response time of the associated impulse response to be reproduced.

21 Claims, 8 Drawing Sheets

30L (30R)

DIGITAL SIGNAL PROCESSING CIRCUIT AND AUDIO REPRODUCING DEVICE USING IT

BACKGROUND OF THE INVENTION

1. Field of the Invention

The present invention relates to a digital signal processing circuit and an audio reproducing device using it such as a headphone device, an earphone device, and a speaker device.

2. Description of the Related Art

When music or the like is reproduced by supplying an audio signal to a speaker that is located in front of a listener, an acoustic image is located in front of the listener. Even for the same audio signal, its reproduction acoustic image is located inside the head of a listener when reproduction is performed by supplying the audio signal to a headphone; the location of the acoustic image is very unnatural.

In view of the above, a headphone device has been developed that locates the acoustic image of an audio signal outside the head.

FIG. 1 shows an example of such a headphone device. An analog audio signal SA is supplied to an A/D converter circuit 2 via an input terminal 1 and thereby A/D-converted to a digital audio signal SD. The digital audio signal SD is supplied to digital signal processing circuits 3L and 3R, which perform processing for locating an acoustic image outside the head.

For example, as shown in FIG. 2, in a case where a sound source SP is located in front of a listener M, a sound that is output from the sound source SP reaches the left ear and the right ear of the listener M along paths represented by transfer functions HL and HR, respectively.

The digital signal processing circuits 3L and 3R calculate the convolutions of the signal SD and impulse responses obtained by converting the transfer functions HL and HR to time domain signals, respectively. The impulse response can be determined in advance by measurement or calculation.

Signals SFL and SFR obtained by the signal processing are supplied to D/A converter circuits 4L and 4R and thereby D/A-converted to analog audio signals SL and SR, which are supplied to left and right acoustic units (electro-acoustic conversion elements) 6L and 6R of a headphone 6 via headphone amplifiers 5L and 5R, respectively.

Therefore, when the listener M listens to a reproduction sound of the headphone 6 mounted on his head, the reproduction sound of the headphone 6 is equivalent to a reproduction sound of a signal that has traveled along the paths having the transfer functions HL and HR and hence a state that the acoustic image SP of the reproduction sound is located outside the head of the listener M as shown in FIG. 2 is realized.

To realize the transfer functions HL and HR, each of the digital signal processing circuits 3L and 3R is given a FIR filter configuration as shown in FIG. 3, for example. As shown in FIG. 3, the signal SD that is output from the A/D converter circuit 2 is supplied to a plurality of cascade-connected delay circuits 3D via an input terminal 31. Signals that are output from the input terminal 31 and the delay circuits 3D are supplied to respective multiplication circuits 3M, and their multiplication outputs are added together by addition circuits 3A and a resulting signal is output from an output terminal 37.

Each of the delay circuits 3D gives a delay of one sampling period (one unit time) τ to the digital audio signal SD. Each of the multiplication circuits 3M has, as a coefficient, an impulse response at each sampling time that is obtained by converting the transfer function HL or HR to a time domain signal.

In reverberation room spaces such as a general room and a concert hall, reflection sounds and reverberation sounds occur in addition to a direct sound from a sound source and hence there is a tendency that a relatively long time is needed for impulse responses of those kinds to attenuate sufficiently.

In view of the above, the digital signal processing circuits 3L and 3R shown in FIG. 3 are required to have a large number of taps and hence many, for example, 1,024, pairs of delay circuits 3D and multiplication circuits 3M are needed.

As a result, for example, in a configuration in which the digital signal processing circuits 3L and 3R are formed by a DSP, a large-capacity memory is needed for the delay circuits 3D and hence the IC scale becomes large and the cost increases greatly. Further, since a large number of process steps are needed to implement many multiplication circuits 3M, a fast calculation process is required. The cost also increases in this respect.

SUMMARY OF THE INVENTION

The present invention has been made to solve the above problems in the art, and an object of the invention is therefore to decrease the number of taps of a digital filter used in an audio reproducing device that locates an acoustic image outside the head.

To attain the above object, the invention provides a digital signal processing circuit comprising two digital filters for reproducing impulse responses that represent transmission characteristics of a first path from a sound source to a left ear of a listener and a second path from the sound source to a right ear of the listener, respectively, the two digital filters producing output audio signals representing convolutions of an input audio signal and impulse responses obtained by converting transfer functions of the first and second paths to time domain signals, respectively, to thereby allow reproduction of reproduction sounds reflecting the transfer functions of the first and second paths, respectively; and a headphone for receiving the output audio signals produced by the two digital filters, respectively, to thereby locate a reproduction acoustic image of the input audio signal outside a head of the listener, wherein a sampling rate in each of the two digital filters is changed depending on a section of a response time of the associated impulse response.

With the above configuration, the number of taps of each digital filter is reduced, resulting in reduction in circuit scale.

DETAILED DESCRIPTION OF THE PREFERRED EMBODIMENTS

In room spaces such as a general room and a concert hall, the reverberation time in a high-frequency range is shorter than in a low-frequency range and high-frequency components generated by a sound source tend to attenuate in a short time. Therefore, where a digital filter is formed by an FIR filter, the number of taps needed to reproduce the frequency characteristic of a transmission system depends on the frequency band; the number of necessary taps decreases as the reproduction frequency band becomes higher, and the former increases as the latter becomes lower.

This indicates that more high-frequency components are included in an early portion of an impulse response to be reproduced, and that a late portion of the impulse response can be reproduced with high fidelity even by reproducing only low-frequency components.

The present invention greatly decreases the number of taps of a digital signal processing circuit, that is, the number of delay circuits and multiplication circuits, by paying attention to the above point. An embodiment of the invention will be described below.

Figure 4:
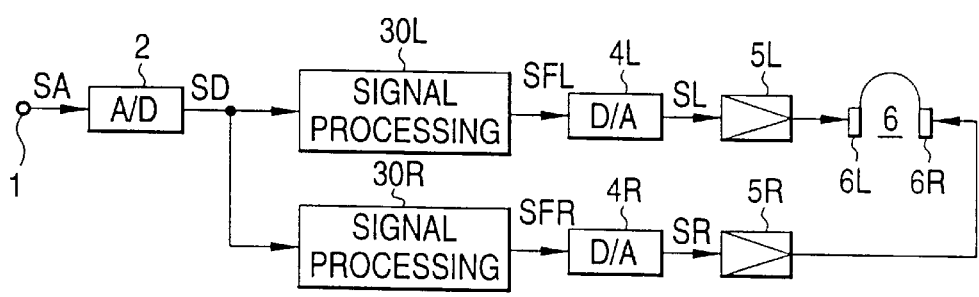
FIG. 4 is a block diagram showing a headphone device according to an embodiment of the invention.

FIG. 4 shows a headphone device according to an embodiment of the invention that makes it possible to locate an acoustic image outside the head. An analog audio signal SA is supplied to an A/D converter circuit 2 via an input terminal 1 and thereby A/D-converted to a digital audio signal SD. The digital audio signal SD is supplied to digital signal processing circuits 30L and 30R. The digital signal processing circuits 30L and 30R calculate the convolutions of the digital audio signal SD and impulse responses obtained by converting the transfer functions HL and HR to time domain signals, respectively. The impulse response can be determined in advance by measurement or calculation.

Signals SFL and SFR produced by the signal processing are supplied to D/A converter circuits 4L and 4R and thereby D/A-converted to analog audio signals SL and SR, which are supplied to left and right acoustic units 6L and 6R of a headphone 6 via headphone amplifiers 5L and 5R, respectively.

Figure 1:
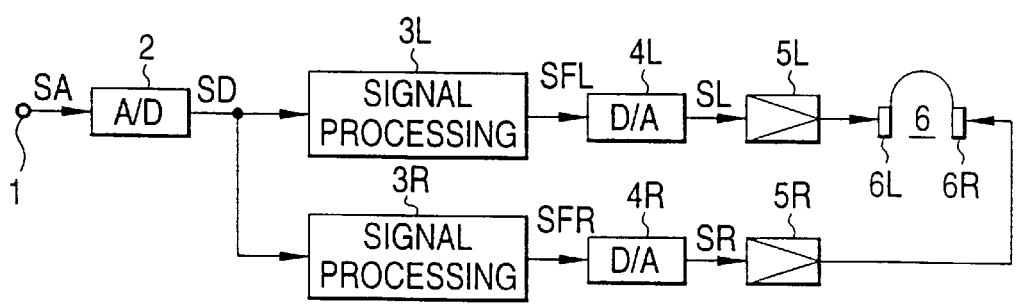
FIG. 1 is a block diagram showing a conventional headphone device.
Figure 2:
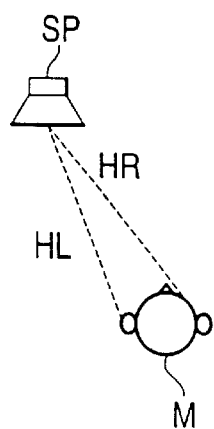
FIG. 2 is a plan view illustrating a relationship between a listener and a sound source located in front of him.

Therefore, when a listener M (see FIG. 2) listens to a reproduction sound of the headphone 6 mounted on his head, the reproduction sound is equivalent to a reproduction sound of a signal that has traveled along the paths represented by the transfer functions HL and HR and hence the acoustic image of the reproduction sound is located outside the head of the listener M.

Figure 5:
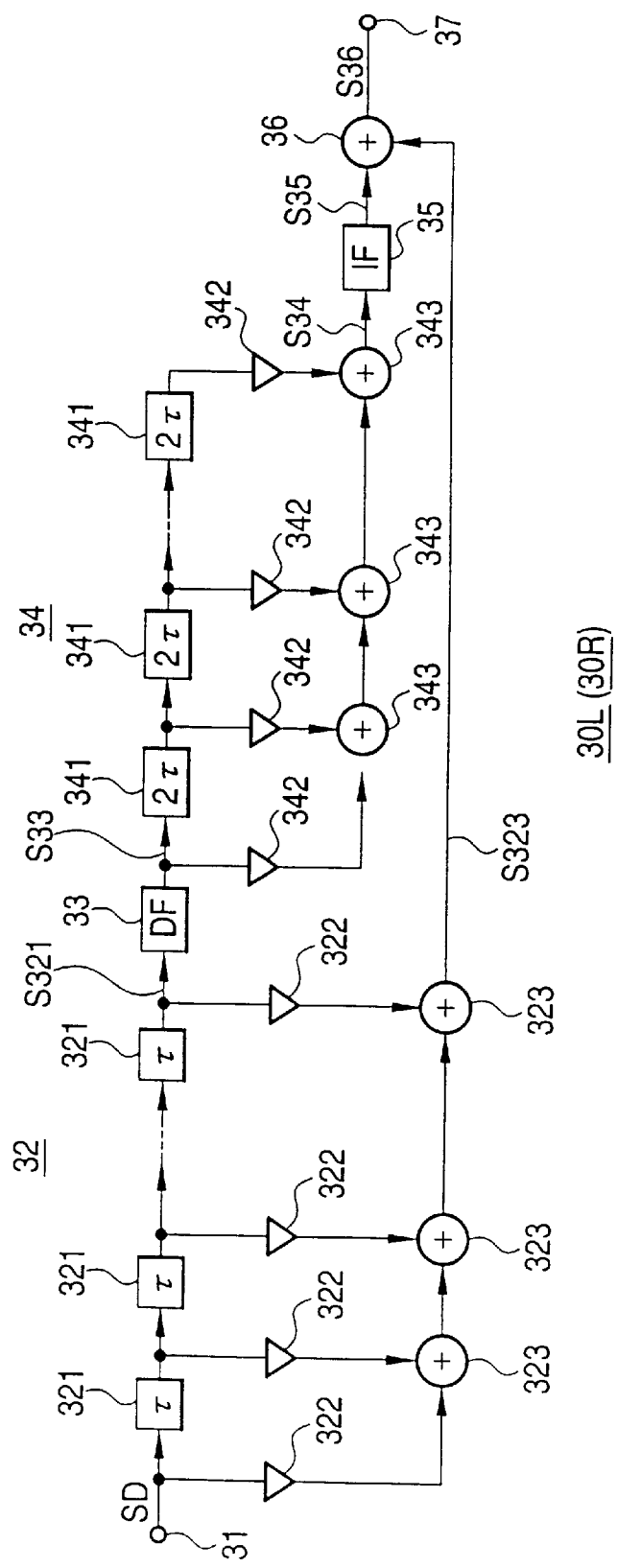
FIG. 5 is a block diagram showing a digital signal processing circuit used in the headphone device of FIG. 4.

Further, in this embodiment, each of the digital signal processing circuits 30L and 30R is configured as shown in FIG. 5, for example.

As shown in FIG. 5, the digital audio signal SD that is output from the A/D converter circuit 2 is supplied to a digital filter 32 via an input terminal 31. The digital filter 32 reproduces an early portion of an impulse response to be reproduced and outputs a response result as well as a delay result.

To this end, the digital audio signal SD coming from the input terminal 31 is supplied to a predetermined number of cascade-connected delay circuits 321 and a signal S321 is produced. Signals SD that are output from the input terminal 31 and outputs 321 from the delay circuits 3D are supplied to respective multiplication circuits 322, and multiplication outputs of the respective multiplication circuits 322 are added together by addition circuits 323 and a resultant signal S323 is produced.

Each of the delay circuits 321 gives a delay of one sampling period (one unit time) $\tau$ to the digital audio signal SD. Each of the multiplication circuits 322 has, as a coefficient, an early portion of an impulse response at each sampling time that is obtained by converting the transfer function HL or HR to a time domain signal. For example, where the sampling frequency for the signal SD is 48 kHz, the number of taps of the digital filter 32 is set at 128.

Therefore, the signal S321 has both of high-frequency components and low-frequency components of the original analog audio signal SA and corresponds to a late portion of the impulse response to be reproduced. The signal S323 corresponds to an early portion of the impulse response to be reproduced and includes more high-frequency components of the original analog audio signal SA.

The signal S321 that is output from the last delay circuit 321 is supplied to a down-sampling decimation filter 33, where it is converted to a digital signal S33 of a sampling rate of 1/n (n: integer greater than or equal to 2), for example, 1/2. That is, a portion of the signal S321 corresponding to low-frequency components of the original analog audio signal SA is extracted as the digital signal S33.

The digital signal S33 is supplied to a digital filter 34, which is to reproduce a late portion of the impulse response to be reproduced and output a response result.

To this end, the digital signal S33 that is output from the decimation filter 33 is supplied to a predetermined number of cascade-connected delay circuits 341. The digital signal S33 and outputs of the delay circuits 341 are supplied to respective multiplication circuits 342. Multiplication outputs of the respective multiplication circuits 342 are added together by addition circuits 343 and resultantly a digital signal S34 is produced.

Each of the delay circuits 341 gives a delay of one sampling period $2\tau$ (in this case, n=2) to the digital audio signal S33. Each of the multiplication circuits 342 has, as a coefficient, an impulse response at each sampling time that is obtained by converting the transfer function HL or HR to a time domain signal. For example, where the sampling frequency for the digital signal S33 is 24 kHz, the number of taps of the digital filter 34 is set at 448.

Therefore, the digital signal S34 corresponds to a late portion of the impulse response to be reproduced and includes more low-frequency components of the original analog audio signal SA.

The digital signal S34 is supplied to an interpolation filter 35 and thereby converted to a digital signal S35 of the same sampling rate as the original digital audio signal SD. The digital signal S35 is supplied to an addition circuit 36. The addition circuit S36 is also supplied with the signal S323 that is output from the digital filter 32. An output signal S36 of the addition circuit 36 is output from an output terminal 37. For example, the digital signal processing circuits 30L and 30R having the above configuration can be formed by a DSP.

With the above configuration, the convolution of the analog audio signal SA (mainly high-frequency components) and an early portion of the impulse response obtained by converting the transfer function HL or HR to a time domain signal is calculated by the digital filter 32. Convolution of the analog audio signal SA (mainly low-frequency components) and a late portion of the impulse response obtained by converting the transfer function HL or HR to a time domain signal is taken by the digital filters 32 and 34.

Since the signal S323 mainly as high-frequency components and the signal S35 mainly as low-frequency components are added to each other by the addition circuit 36, the signal S36 as an addition output is equivalent to a signal as would be obtained by calculating the convolution of the analog audio signal SA and the impulse response obtained by converting the transfer function HL or HR to a time domain signal.

The signal S36 is taken out as an output of the digital signal processing circuit 30L or 30R and supplied to the D/A converter circuit 4L or 4R as described in connection with FIG. 4. Therefore, when the audio signals SL and SR are reproduced by the headphone 6, the acoustic image of a reproduction sound can be located outside the head of the listener M.

As described above, the digital signal processing circuits 30L and 30R can perform the signal processing for locating the acoustic image outside the head during reproduction by the headphone 6. In this signal processing, while the digital filters 32 and 34 perform convolution processing for locating the acoustic image outside the head for low-frequency components of the analog audio signal SA, the sampling rate of the signal in the digital filter 34 is made 1/2, for example, of that of the signal in the digital filter 32. Therefore, the number of taps of the digital filter 34 can be decreased.

Figure 3:
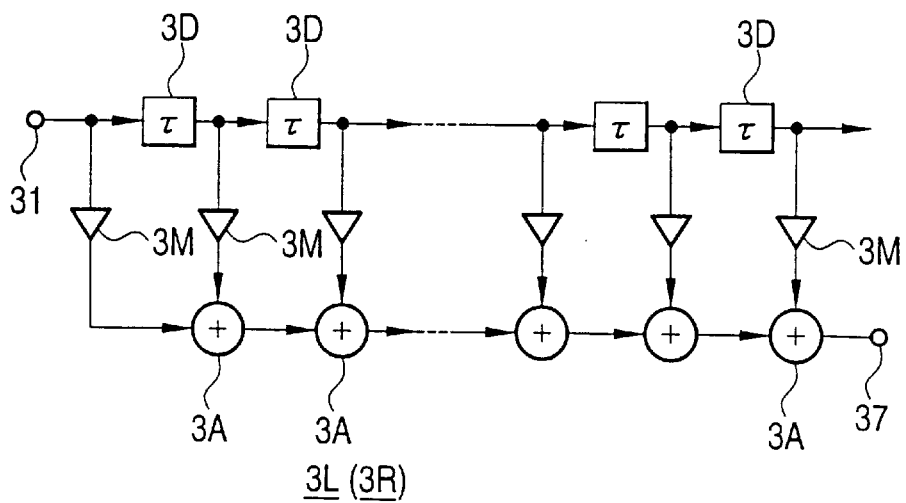
FIG. 3 is a block diagram showing an FIR filter as a digital signal processing circuit used in the headphone device of FIG. 1.

As described in connection with FIG. 3, the number of taps of the digital filter constituting the digital signal processing circuit 3L or 3R is 1,024, for example. Since the number of taps of the digital filter 32 shown in FIG. 5 is 128, according to conventional designing the number of taps of the digital filter 34 would be 896 (=1,024−128).

However, since the sampling frequency of the signal in the digital filter 34 is made 1/2 of that of the signal in the digital filter 32, the number of taps of the digital filter 34 can be halved to 448 for signal processing of the same response time. Therefore, the total number of taps of the digital filters 32 and 34 can be decreased to 576 (128+448).

The decrease in the number of taps of the digital filter 34 results in reduction in the scale of the digital signal processing circuits 30L and 30R. For example, when they are formed by a DSP, the capacity of a memory that constitutes the delay circuits 321 and 341 can be decreased and hence the IC scale can be reduced. This leads to reduction in both cost and power consumption.

Further, since locating the acoustic image of a reproduction sound during reproduction by the headphone 6 is realized by using such digital filters, the cost of the headphone device can also be reduced.

Figure 6:
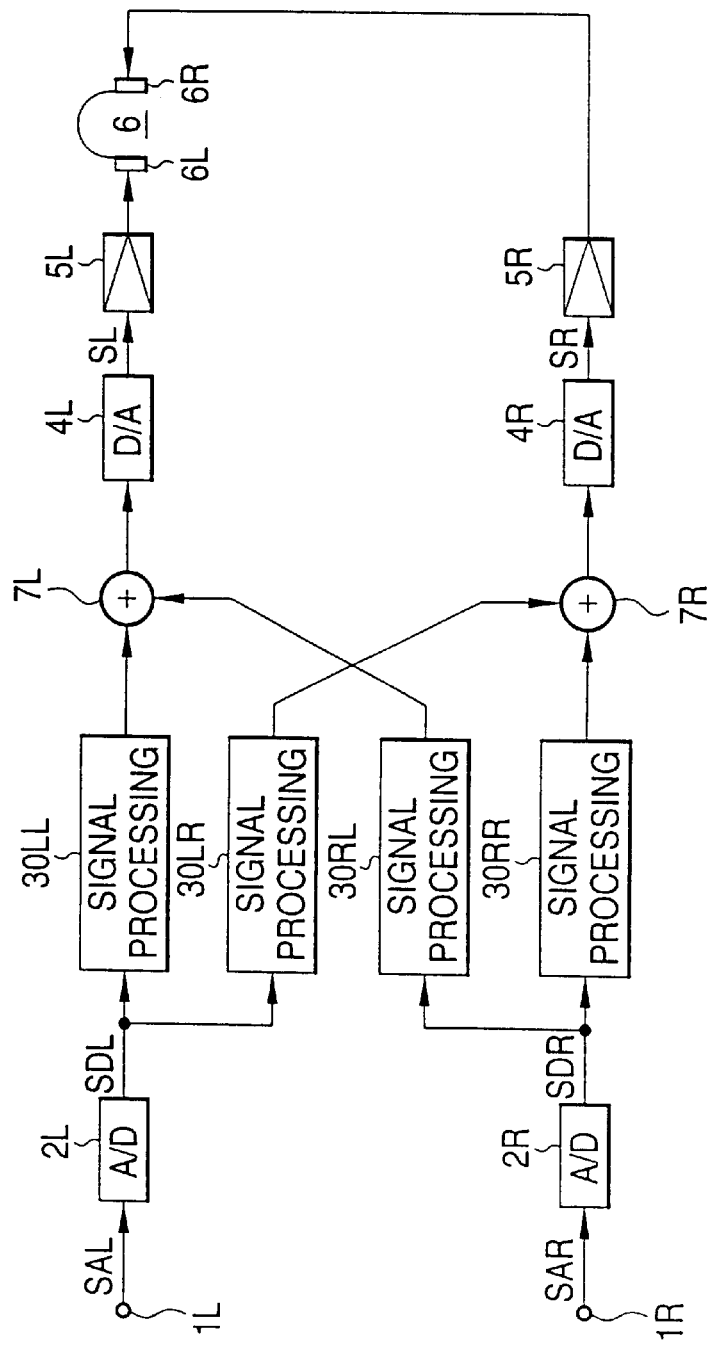
FIG. 6 is a block diagram showing a headphone device according to another embodiment of the invention.

FIG. 6 shows a case where the invention is applied to a headphone device in which 2-channel stereo audio signals are reproduced by a headphone and the acoustic image of a reproduction sound is located outside the head of a listener who is mounted with the headphone.

Left-channel and right-channel analog audio signals SAL and SAR are supplied to A/D converter circuits 2L and 2R via input terminals 1L and 1R and thereby converted to digital audio signals SDL and SDR, respectively. The digital audio signal SDL is supplied to digital signal processing circuits 30LL and 30LR and the digital audio signal SDR is supplied to digital signal processing circuits 30RL and 30RR.

The digital signal processing circuits 30LL-30RR are configured in the same manner as the digital signal processing circuits 30L and 30R shown in FIG. 5. The digital signal processing circuits 30LL-30RR perform signal processing for locating the acoustic image outside the head on the audio signals SDL and SDR so as to produce, when the audio signals SL and SR are reproduced by a headphone 6, a reproduction sound field close to that as would be obtained by reproducing the audio signals SAL and SAR by speakers.

Figure 7:
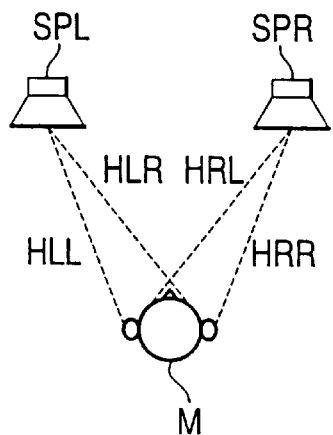
FIG. 7 is a plan view illustrating a relationship between a listener and two sound sources.

For example, as shown in FIG. 7, when sound sources SPL and SPR are located at a front-left position and a front-right position with respect to a listener M, respectively, a sound that is output from the sound source SPL reaches the left ear and the right ear of the listener M along paths represented by transfer functions HLL and HLR, respectively, and a sound that is output from the sound source SPR reaches the left ear and the right ear of the listener M along paths represented by transfer functions HRL and HRR, respectively, where HLL: transfer function of the path from the sound source SPL to the left ear of the listener M;

HLR: transfer function of the path from the sound source SPL to the right ear of the listener M;

HRL: transfer function of the path from the sound source SPR to the left ear of the listener M; and HRR: transfer function of the path from the sound source SPR to the right ear of the listener M.

In view of the above, the digital signal processing circuit 30LL calculates the convolution of the audio signal SDL and an impulse response obtained by converting the transfer function HLL to a time domain signal. The digital signal processing circuit 30LR calculates the convolution of the audio signal SDL and an impulse response obtained by converting the transfer function HLR to a time domain signal. The digital signal processing circuit 30RL calculates the convolution of the audio signal SDR and an impulse response obtained by converting the transfer function HRL to a time domain signal. The digital signal processing circuit 30RR calculates the convolution of the audio signal SDR and an impulse response obtained by converting the transfer function HRR to a time domain signal.

Output signals of the digital signal processing circuits 30LL and 30RL are supplied to an addition circuit 7L and thereby added to each other. Output signals of the digital signal processing circuits 30LR and 30RR are supplied to an addition circuit 7R and thereby added to each other. Output signals of the addition circuits 7L and 7R are supplied to respective D/A converter circuits 4L and 4R and thereby D/A-converted to analog audio signals SL and SR, which are supplied to left and right acoustic units 6L and 6L of the headphone 6 via headphone amplifiers 5L and 5R, respectively.

Therefore, a reproduction sound field approximately equal to that as would be obtained when the audio signals SAL and SAR were supplied to speakers located at the front-left position and the front-right position with respect to the listener M is reproduced by supplying the audio signals SL and SR to the headphone 6. The acoustic image of a reproduction sound is located outside the head of the listener M.

Also in this case, since the digital signal processing circuits 30LL-30RR can be configured in the same manner as shown in FIG. 5, for example, the circuit scale can be reduced, resulting in reduction in both cost and power consumption.

Further, since locating the acoustic image of a reproduction sound during reproduction by the headphone 6 is realized by using such digital filters, the cost of the headphone device can also be reduced.

Figure 8:
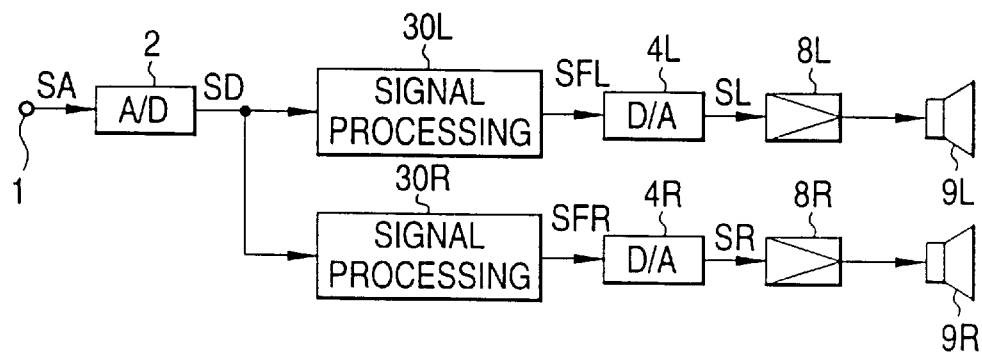
FIG. 8 is a block diagram showing a speaker device according to a further embodiment of the invention.

FIG. 8 shows a case of locating a reproduction acoustic image at an arbitrary position by using two speakers.

As shown in FIG. 8, an analog audio signal SA is supplied, via an input terminal 1, to an A/D converter circuit 2 and thereby A/D-converted to a digital audio signal SD, which is supplied to digital signal processing circuits 30L and 30R. The digital signal processing circuits 30L and 30R calculate the convolutions of the digital audio signal SD and impulse responses obtained by converting transfer functions described below to time domain signals, respectively.

Signals SFL and SFR produced by the above signal processing are supplied to D/A converter circuits 4L and 4R and thereby D/A-converted to analog audio signals SL and SR. The analog audio signals SL and SR are supplied to left-channel and right-channel speakers 9L and 9R that are located at a front-left position and a front-right position with respect to a listener via speaker amplifiers 8L and 8R, respectively.

Figure 9:
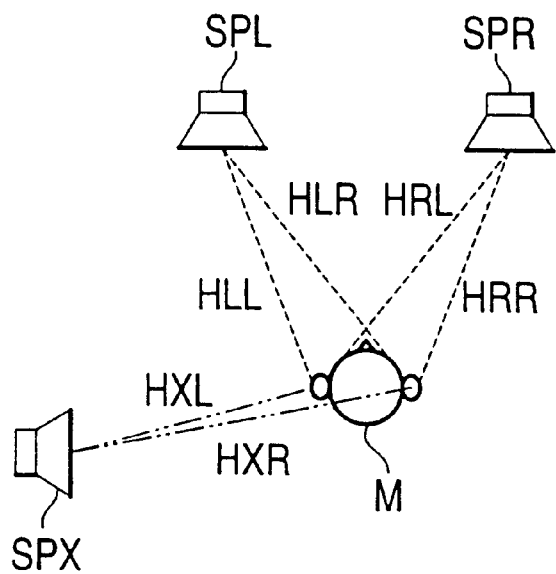
FIG. 9 is a plan view illustrating how a reproduction acoustic image is located at an arbitrary position.

The digital signal processing circuits 30L and 30R perform the following processing. Now, as shown in FIG. 9, assume a case of equivalently reproducing a sound source SPX at an arbitrary position by using sound sources SPL and SPR that are located at a front-left position and a front-right position with respect to a listener M.

The sound sources SPL and SPR can be given by $$SPL=\{(HXL \times HRR-HXR \times HRL)/(HLL \times HRR-HLR \times HRL)\} \times SPX \quad (1)$$

$$SPR=\{(HXR \times HLL-HXL \times HLR)/(HLL \times HRR-HLR \times HRL)\} \times SPX \quad (2)$$

where

HLL: transfer function of the path from the sound source SPL to the left ear of the listener M;

HLR: transfer function of the path from the sound source SPL to the right ear of the listener M;

HRL: transfer function of the path from the sound source SPR to the left ear of the listener M;

HRR: transfer function of the path from the sound source SPR to the right ear of the listener M;

HXL: transfer function of the path from the sound source SPX to the left ear of the listener M; and HXR: transfer function of the path from the sound source SPX to the right ear of the listener M.

Therefore, the reproduction acoustic image of the audio signal SA can be located at the position of the sound source SPX by supplying an input audio signal SXA corresponding to the sound source SPX to a speaker located at the position of the sound source SPL via a filter as an implementation of the transfer function portion of Equation (1) and supplying the input audio signal SXA to a speaker located at the position of the sound source SPR via a filter as an implementation of the transfer function portion of Equation (2).

The digital signal processing circuits 30L and 30R calculate the convolutions of the received digital audio signal SD and impulse responses obtained by converting transfer functions similar to the transfer function portions of Equations (1) and (2) to a time domain signal, respectively. For example, the digital signal processing circuits 30L and 30R are configured as shown in FIG. 5.

The reproduction acoustic image of the analog audio signal SA can thus be located at the position of the sound source SPX.

Also in this case, since the digital signal processing circuits 30L and 30R can be configured in the same manner as shown in FIG. 5, for example, the circuit scale can be reduced, resulting in reduction in both cost and power consumption.

Figure 10:
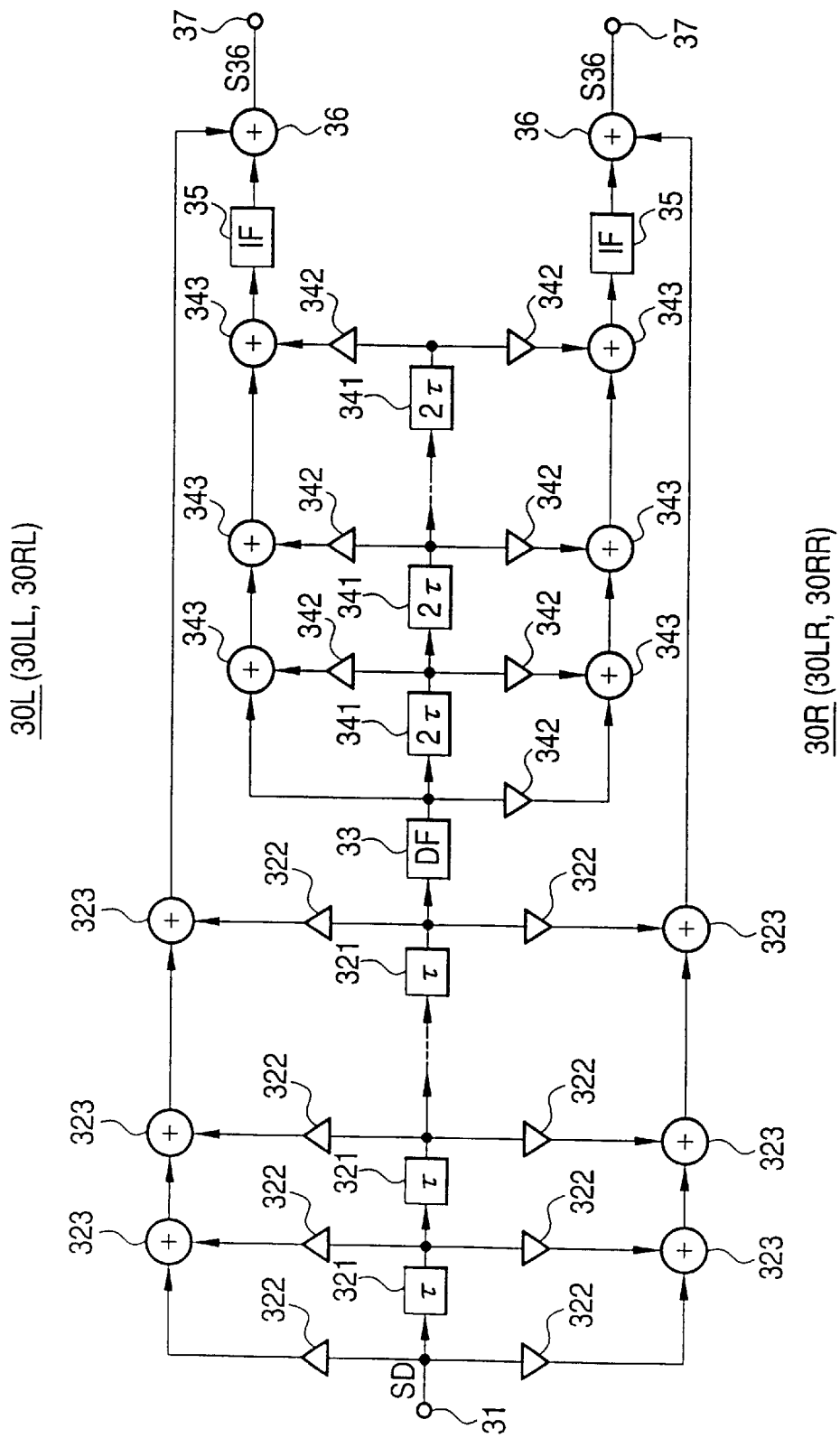
FIG. 10 is a block diagram showing a digital signal processing circuit according to a modification.

In the embodiment of FIGS. 4 and 5, for example, the delay circuits 321 and 341 and the decimation filter 33 of the digital signal processing circuit 30L handle the same signal as those of the digital signal processing circuit 30R. Therefore, as shown in FIG. 10, for example, the delay circuits 321 and 341 and the decimation filter 33 of the digital signal processing circuit 30L can be commonized with those of the digital signal processing circuit 30R.

For the same reason, in the embodiment of FIGS. 6 and 5, the delay circuits 321 and 341 and the decimation filter 33 of the digital signal processing circuit 30LL can be commonized with those of the digital signal processing circuit 30LR and the delay circuits 321 and 341 and the decimation filter 33 of the digital signal processing circuit 30RL can be commonized with those of the digital signal processing circuit 30RR.

It is noted that the invention can similarly be applied to a case of handling audio signals that are multi-channel stereo signals of four or more channels.

As described above, in the invention, while an early portion of an impulse response to be reproduced is processed at a dominant sampling rate, a late portion of the impulse response is processed at a sampling rate that is 1/n of the dominant one in the same response time as the early portion. Therefore, the number of taps of digital filters necessary for the process can be reduced.

As a result, the circuit scale of the digital filters can be reduced, which leads to reduction in both cost and power consumption. Further, the cost of a headphone device or a speaker device using such digital filters can also be reduced.

What is claimed is:

1. A digital signal processing circuit for reproducing an impulse response that represents a transmission characteristic between two points of a transmission system, the transmission characteristic having been determined in advance by one of measurement and calculation, comprising:

a digital filter; and means for changing a sampling rate in the digital filter depending on a section of a response time of the impulse response to be reproduced, wherein the digital filter comprises an upstream digital filter and a downstream digital filter that are connected to each other in cascade, and wherein the downstream digital filter has a sampling rate that is 1/n of a sampling rate of the upstream digital filter, where n is an integer that is greater than or equal to 2.

2. The digital signal processing circuit according to claim 1, wherein the digital filter is an FIR filter.

3. The digital signal processing circuit according to claim 1, wherein each of the upstream digital filter and the downstream digital filter is an FIR filter.

4. A digital signal processing circuit comprising:

two digital filters for reproducing impulse responses that represent transmission characteristics of a first path from a sound source to a left ear of a listener and a second path from the sound source to a right ear of the listener, respectively, wherein the two digital filters produce signals representing convolutions of an input audio signal and impulse responses obtained by converting transfer functions of the first and second paths to time domain signals, respectively, to thereby allow reproduction of reproduction sounds representing the transfer functions of the first and second paths, respectively; and means for changing a sampling rate in each of the two digital filters depending on a section of a response time of the associated impulse response, wherein each of the two digital filters comprises an upstream digital filter and a downstream digital filter that are connected to each other in cascade, and wherein the downstream digital filter has a sampling rate that is 1/n of a sampling rate of the upstream digital filter, where n is an integer that is greater than or equal to 2.

5. The digital signal processing circuit according to claim 4, wherein each of the two digital filters is an FIR filter.

6. The digital signal processing circuit according to claim 4, wherein each of the upstream digital filter and the downstream digital filter is an FIR filter.

7. An audio reproducing device comprising:

two digital filters for reproducing impulse responses that represent transmission characteristics of a first path from a sound source to a left ear of a listener and a second path from the sound source to a right ear of the listener, respectively, the two digital filters producing output audio signals representing convolutions of an input audio signal and impulse responses obtained by converting transfer functions of the first and second paths to time domain signals, respectively, to thereby allow reproduction of reproduction sounds representing the transfer functions of the first and second paths, respectively;

two earphone devices for receiving the output audio signals produced by the two digital filters, respectively, to thereby locate a reproduction acoustic image of the input audio signal outside a head of the listener; and means for changing a sampling rate in each of the two digital filters depending on a section of a response time of the associated impulse response, wherein each of the two digital filters comprises an upstream digital filter and a downstream digital filter that are connected to each other in cascade, and wherein the downstream digital filter has a sampling rate that is 1/n of a sampling rate of the upstream digital filter, where n is an integer that is greater than or equal to 2.

8. The audio reproducing device according to claim 7, wherein each of the two digital filters is an FIR filter.

9. The audio reproducing device according to claim 7, wherein each of the upstream digital filter and the downstream digital filter is an FIR filter.

10. A digital signal processing circuit comprising:

first and second digital filters for producing first and second output audio signals by calculating convolutions of a first input audio signal and impulse responses obtained by converting, to time domain signals, transfer functions of a first path from a first sound source located at a front-left position with respect to a listener to a left ear of the listener and a second path from the first sound source to a right ear of the listener, respectively;

third and fourth digital filters for producing third and fourth output audio signals by calculating convolutions of a second input audio signal and impulse responses obtained by converting, to time domain signals, transfer functions of a third path from a second sound source located at a front-right position with respect to the listener to the left ear of the listener and a fourth path from the second sound source to the right ear of the listener, respectively;

a first addition circuit for adding to each other the first and third output audio signals that are produced by the first and third digital filters;

a second addition circuit for adding to each other the second and fourth output audio signals that are produced by the second and fourth digital filters; and means for changing a sampling rate in each of the first to fourth digital filters depending on a section of a response time of the associated impulse response, wherein each of the first to fourth digital filter comprises an upstream digital filter and a downstream digital filter that are connected to each other in cascade, and wherein the downstream digital filter has a sampling rate that is 1/n of a sampling rate of the upstream digital filter, where n is an integer that is greater than or equal to 2.

11. The digital signal processing circuit according to claim 10, wherein each of the first to fourth digital filters is an FIR filter.

12. The digital signal processing circuit according to claim 10, wherein each of the upstream digital filter and the downstream digital filter is an FIR filter.

13. An audio reproducing device comprising:

first and second digital filters for producing first and second output audio signals by calculating convolutions of a first input audio signal and impulse responses obtained by converting, to time domain signals, transfer functions of a first path from a first sound source located at a front-left position with respect to a listener to a left ear of the listener and a second path from the first sound source to a right ear of the listener, respectively;

third and fourth digital filters for producing third and fourth output audio signals by calculating convolutions of a second input audio signal and impulse responses obtained by converting, to time domain signals, transfer functions of a third path from a second sound source located at a front-right position with respect to the listener to the left ear of the listener and a fourth path from the second sound source to the right ear of the listener, respectively;

a first addition circuit for adding to each other the first and third output audio signals that are produced by the first and third digital filters;

a second addition circuit for adding to each other the second and fourth output audio signals that are produced by the second and fourth digital filters;

two earphone devices for receiving output signals of the first and second addition circuits, respectively, to thereby locate reproduction acoustic images of the first and second input audio signals outside a head of the listener; and means for changing a sampling rate in each of the first to fourth digital filters depending on a section of a response time of the associated impulse response, wherein each of the first to fourth digital filters comprises an upstream digital filter and a downstream digital filter that are connected to each other in cascade, and wherein the downstream digital filter has a sampling rate that is 1/n of a sampling rate of the upstream digital filter, where n is an integer that is greater than or equal to 2.

14. The audio reproducing device according to claim 13, wherein each of the first to fourth digital filters is an FIR filter.

15. The audio reproducing device according to claim 13, wherein each of the upstream digital filter and the downstream digital filter is an FIR filter.

16. An audio reproducing device comprising:

a plurality of digital filters for producing output audio signals for a plurality of paths, respectively, by calculating convolutions of an input audio signal and impulse responses obtained by converting transfer functions of the plurality of paths to time domain signals, respectively;

a plurality of speakers for receiving the respective output audio signals, to thereby locate a reproduction acoustic image of the input audio signal at an arbitrary position; and means for changing a sampling rate in each of the plurality of digital filters depending on a section of a response time of the associated impulse response, wherein each of the plurality of digital filters comprises an upstream digital filter and a downstream digital filter that are connected to each other in cascade, and wherein the downstream digital filter has a sampling rate that is 1/n of a sampling rate of the upstream digital filter, where n is an integer that is greater than or equal to 2.

17. The audio reproducing device according to claim 16, wherein each of the plurality of digital filters is an FIR filter.

18. The audio reproducing device according to claim 16, wherein each of the upstream digital filter and the downstream digital filter is an FIR filter.

19. An audio reproducing device comprising:

a plurality of digital filters for producing two-channel output audio signals by calculating convolutions of an audio signal of a predetermined channel among multi-channel audio signals and impulse responses obtained by converting transfer functions of paths from a predetermined sound source position to left and right ears of a listener from frequency domain signals to time domain signals, respectively;

two speakers located respectively at a front-left position and a front-right position with respect to the listener for receiving the two-channel output audio signals, to thereby locate a reproduction acoustic image of the audio signal of the predetermined channel at the predetermined sound source position; and means for changing a sampling rate in each of the plurality of digital filters depending on a section of a response time of the associated impulse response, wherein each of the plurality of digital filters comprises an upstream digital filter and a downstream digital filter that are connected to each other in cascade, and wherein the downstream digital filter has a sampling rate that is 1/n of a sampling rate of the upstream digital filter, where n is an integer that is greater than or equal to 2.

20. The audio reproducing device according to claim 19, wherein each of the plurality of digital filters is an FIR filter.

21. The audio reproducing device according to claim 19, wherein each of the upstream digital filter and the downstream digital filter is an FIR filter.

* * * * *